(12) United States Patent
Hammerschmidt et al.

(10) Patent No.: US 8,058,993 B2
(45) Date of Patent: Nov. 15, 2011

(54) CAPACITIVE DETECTION SYSTEMS AND METHODS

(75) Inventors: Dirk Hammerschmidt, Villach (AT); Armin Satz, Arnoldstein (AT); Tobias Werth, Villach (AT)

(73) Assignee: Infineon Technologies AG, Neubiberg (DE)

( * ) Notice: Subject to any disclaimer, the term of this patent is extended or adjusted under 35 U.S.C. 154(b) by 448 days.

(21) Appl. No.: 12/241,162

(22) Filed: Sep. 30, 2008

(65) Prior Publication Data

US 2010/0079283 A1    Apr. 1, 2010

(51) Int. Cl.
*G08B 13/26* (2006.01)

(52) U.S. Cl. ............ 340/562; 341/33; 280/735

(58) Field of Classification Search ......... 340/562, 340/686.6; 280/735; 341/33; 361/181
See application file for complete search history.

(56) References Cited

U.S. PATENT DOCUMENTS

| | | | |
|---|---|---|---|
| 4,733,222 A | 3/1988 | Evans | |
| 5,547,216 A * | 8/1996 | Iwata et al. | 280/735 |
| 5,952,835 A | 9/1999 | Coveley | |
| 6,018,980 A * | 2/2000 | Kimura et al. | 73/12.04 |
| 6,429,782 B2 * | 8/2002 | Pavatich et al. | 340/686.6 |
| 6,469,524 B1 * | 10/2002 | Oberdier | 324/688 |
| 6,724,324 B1 * | 4/2004 | Lambert | 341/33 |
| 6,794,728 B1 * | 9/2004 | Kithil | 257/532 |
| 2004/0226800 A1 | 11/2004 | Pierga | |
| 2006/0196716 A1 | 9/2006 | Hawes | |

OTHER PUBLICATIONS

Application and File History of U.S. Appl. No. 12/392,114, filed Feb. 25, 2009, Inventor: Hammerschmidt et al., as available at www.uspto.gov.

* cited by examiner

*Primary Examiner* — John A Tweel, Jr.
(74) *Attorney, Agent, or Firm* — Patterson Thuente Christensen Pedersen, P.A.

(57) ABSTRACT

The invention is related to capacitive sensing and detection systems and methods. In one embodiment, a capacitive sensor system comprises a first electrode and a second electrode forming a first capacitive sensor mounted to a vehicle and configured to create a first electric field directed outward from the vehicle, and a control unit coupled to the first and second electrodes and configured to measure a change in the first electric field. In another embodiment, a method comprises capacitively sensing an object relative to a vehicle and communicating information related to the object. In yet another embodiment, a method comprises configuring a capacitive sensor to sense an object relative to a vehicle, and providing a path to communicate information from the capacitive sensor.

17 Claims, 10 Drawing Sheets

CAPACITIVE DETECTION SYSTEMS AND METHODS

BACKGROUND OF THE INVENTION

Capacitive sensors can be used for distance measurement and position detection. Various arrangements of the electrodes of such sensors create an electric field between the electrodes. As the electric field changes, a corresponding current change can be measured, and the parameters of a coupling network between the electrodes can be determined from the relationship between current and voltage.

An object that is brought or moves into the field between the electrodes can alter the properties of the field in a variety of ways. For example, the object can increase the coupling by coupling via a higher permittivity. The object can also increase the coupling by electrical conductance. Additionally, the object can decrease the coupling by causing a surge of part of the field to ground.

Using multiple electrodes, a kind of electrical tomography of the space in front of the electrodes can be produced. This sensing principle is currently well-known for the realization of seat occupant sensors for the front passenger seat of a vehicle. Additional sensing and measurement challenges in automobiles and other applications may also be met by capacitive sensors, which can be less complex and therefore less expensive than other technologies while also providing technological advantages.

SUMMARY OF THE INVENTION

The invention is related to capacitive sensing and detection systems and methods. In one embodiment, a capacitive sensor system comprises a first electrode and a second electrode forming a first capacitive sensor mounted to a vehicle and configured to create a first electric field directed outward from the vehicle, and a control unit coupled to the first and second electrodes and configured to measure a change in the first electric field.

In another embodiment, a method comprises capacitively sensing an object relative to a vehicle and communicating information related to the object.

In yet another embodiment, a method comprises configuring a capacitive sensor to sense an object relative to a vehicle, and providing a path to communicate information from the capacitive sensor.

BRIEF DESCRIPTION OF THE DRAWINGS

The invention may be more completely understood from the following detailed description of various embodiments in connection with the accompanying drawings, in which.

Figure 1:
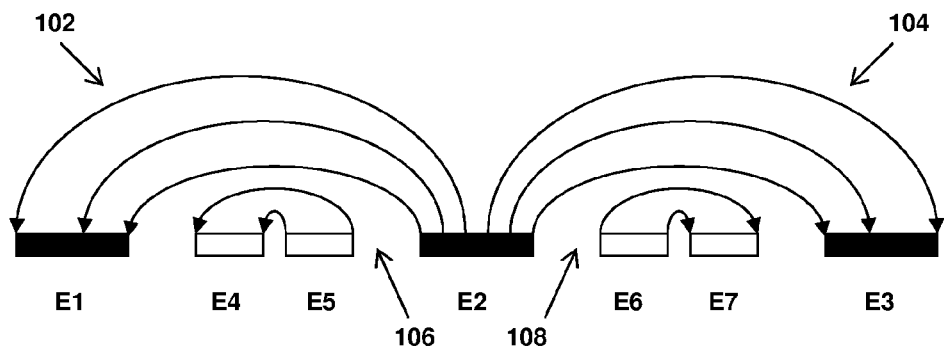
FIG. 1 is an electrode diagram according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The invention is related to capacitive sensing systems and methods. In various embodiments, the invention relates to object detection and event pre-warning and detection systems and methods, such as in automotive applications. Embodiments of the invention can reduce the cost and complexity of components needed to implement such systems and methods while also providing improved functionality. The invention can be more readily understood by reference to FIGS. 1-23 and the following description. While the invention is not necessarily limited to the specifically depicted application(s), the invention will be better appreciated using a discussion of exemplary embodiments in specific contexts.

Referring to FIG. 1, a plurality of electrodes E1-E8 is shown. A first electric field 102 is formed between electrodes E1 and E2, and a second electric field 104 is formed between electrodes E2 and E8. A third electric field 106 is formed between electrodes E4 and E5, and a fourth electric field 108 is formed between electrodes E6 and E7.

Such an arrangement of electrodes can be used, for example, for object distance detection and estimation in one embodiment. Electric fields 102 and 104 provide an initial, more distant indication of the presence or approach of an object, while electric fields 106 and 108 provide detection of a nearer object. In such an embodiment, it is irrelevant whether an object increases the coupling between electrodes by introducing conduction or permittivity or instead decreases the coupling by shielding. As a distance between an object and a pair of electrodes E1-E8 changes, one or more of fields 102-108 will be affected. Additionally, a change in time between an object first influencing one or both of fields 102 and 104 and subsequently influencing one or both of fields 106 and 108 can be used to calculate a speed of the object as the detection distance of the various pairs of electrodes E1-E8 is known.

Figure 2:
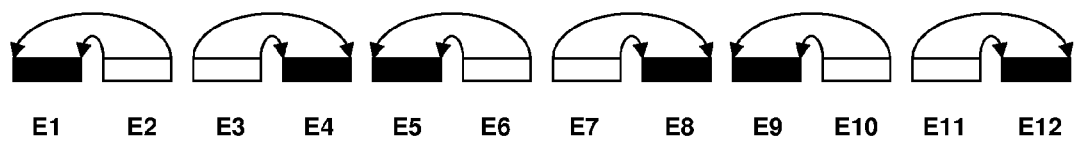
FIG. 2 is an electrode diagram according to an embodiment.
Figure 3:
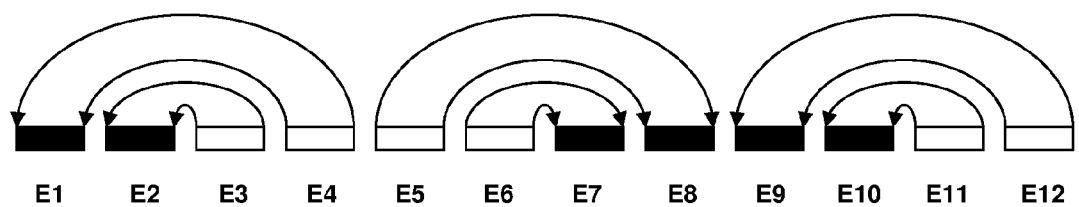
FIG. 3 is an electrode diagram according to an embodiment.
Figure 4:
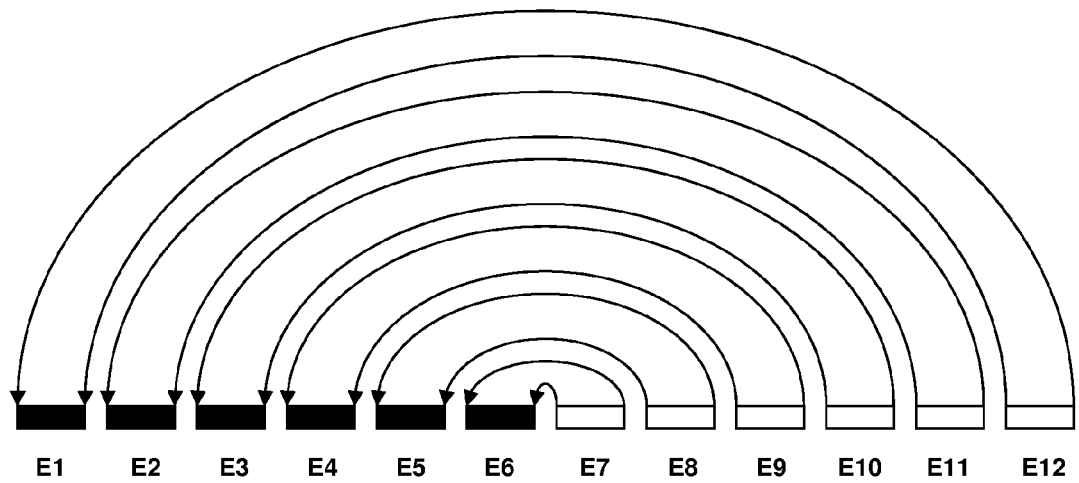
FIG. 4 is an electrode diagram according to an embodiment.

The principle illustrated in FIG. 1 can be extended by using additional or alternate electrode arrangements, groupings and pairings. For example, a near-distance detection electrode arrangement is depicted in FIG. 2, with various pairings of transmit electrodes E2, E3, E6, E7, E10 and E11 with receive electrodes E1, E4, E5, E8, E9 and E12, respectively. In FIG. 3, the same electrodes E1-E12 are reconfigured in a mid-distance detection arrangement, with electrodes E3-E6, E11 and E12 as transmit electrodes and electrodes E1, E2 and E7-E10 as receive electrodes. In FIG. 4, electrodes E1-E12 are reconfigured in a longer-distance detection configuration. Electrodes E7-E12 are configured as transmit electrodes, and electrodes E1-E6 are configured as receive electrodes. In addition to the configurations of FIGS. 1-4, additional electrode arrangement configurations are also possible, such as by using more than two electrodes groups, combining various electrode arrangements, using an array of identical electrodes that can be stimulated group-wise, and various combinations thereof.

Figure 5:
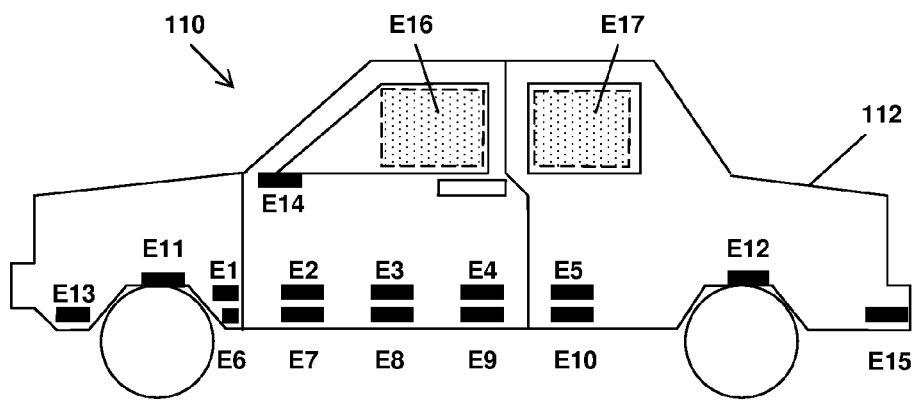
FIG. 5 is a system diagram according to an embodiment.

The electrode configurations depicted in FIGS. 1-4 as well as combinations thereof can form part of a pre-crash warning system on a vehicle in various embodiments. Referring to FIG. 5, one embodiment of a side crash pre-warning and detection system 110 implemented on a vehicle 112 is depicted. System 110 comprises a plurality of electrodes E1-E16 mounted in or to vehicle 112. In one embodiment, electrodes E1-E16 are externally coupled to vehicle 112. In another embodiment, electrodes E1-E16 are embedded in vehicle 112. In further embodiments, electrodes E1-E16 are otherwise mounted in or to vehicle 112. The particular positions of electrodes E1-E16 depicted in FIG. 5 are only an example of one embodiment of system 110, and other embodiments can comprise more or fewer electrodes arranged in various other configurations. For example, the embodiment of FIG. 5 is a side crash system, while other embodiments can comprise frontal, rear or combination systems, as described in more detail below. Further, electrode placement and configuration can vary for different vehicle sizes and types, such as sedans, convertibles, minivans, trucks, commercial vehicles, and others.

In the embodiment of FIG. 5, electrodes E1-E5 are mounted at a skirting or lower door area of vehicle 112. This area is often vulnerable to a side-impact crash due to its height. Electrodes E6-10 are mounted at a sideskirt area of vehicle 112. Additional electrodes E11 and E12 are respectively mounted at front and rear wheel housing areas. Electrode E13 is mounted at a front bumper or lower spoiler area, electrode E14 is mounted at or to a sideview mirror, and electrode E15 is mounted at a rear bumper area.

In one embodiment, additional electrodes E16 and E17 are incorporated into front and rear side windows, respectively. Electrodes E16 and E17 comprise vapor-deposited thin metal films on the glass of the windows in one embodiment. Coupling to the glass and electrodes E16 and E17 is not galvanic but rather capacitive in one embodiment. Thus, an electric field inside the door can be coupled to the window electrode E16, E17 which then can emit the field external to vehicle 112.

In one embodiment, electrodes E1, E3, E5, E6, E8 and E10 comprise a set of transmit or receive electrodes, while electrodes E2, E4, E7 and E9 comprise a corresponding set of receive or transmit electrodes. Various other arrangements and configurations, such as described herein above with reference to FIGS. 1-4, can be used in further embodiments. In other embodiments, one or more of electrodes E1-E17 can represent a pair or plurality of electrodes at each respective location. For example, electrode E14 can comprise a transmit electrode and a receive electrode in one embodiment.

In operation, transmit electrodes, for example electrodes E1, E3, E5, E6, E8 and E10, emit signals that are received by receive electrodes, for example electrodes E2, E4, E7 and E9, in one embodiment, forming electric fields for near-distance sensing as described herein above with reference to FIGS. 1-4. Fields emitted by electrodes E11-E17 can be received by the same receive electrodes in multiplex to provide longer-distance sensing. Objects approaching vehicle 112 and entering one or more of the electric fields can be detected by observing changes in the coupling factor of the relevant electrodes. Tracking any such changes over time provides for estimating movement, speed and other characteristics of the object before the object has come into contact with vehicle 112. Additionally, system 110 can be coupled to or form a part of an airbag restraint system, such that pre-crash object detection information can be selectively used to trigger airbag or other safety system deployment.

In another embodiment, electrodes forming capacitive sensors are mounted inside a vehicle door, panel, bumper or other body part and provide improved crash detection systems. Currently, for example, side impact crashes can be detected by measuring a pressure inside a vehicle door compartment, wherein the pressure rises if the door is impacted and deformed. For enhanced safety and detection redundancy, a second measurement can be made by a sensor, such as an acceleration sensor at the B-pillar of the vehicle. Although other configurations and nomenclatures may be used, the A-pillar is typically the vertical roof support at the front windshield, and the C-pillar is often the vertical support at the rear window, with the B-pillar located between the two, such as between the front and back side door windows. One disadvantage of using an acceleration sensor, however, is that a longer period of time is needed to determine and analyze information from the acceleration sensor, which can delay airbag deployment.

Figure 6:
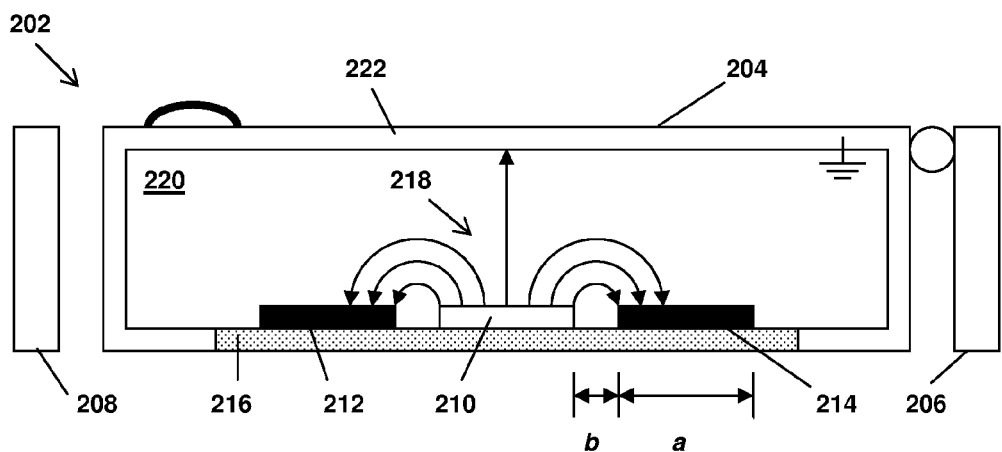
FIG. 6 is a diagram of a vehicle door according to an embodiment.

Referring to FIG. 6, an internal capacitive sensor system 202 that avoids use of an acceleration sensor is depicted. System 202 is mounted within a vehicle door 204, such as a front door between an A-pillar 206 and a B-pillar 208. In other embodiments, system 202 can be used in rear side doors between B-pillar 208 and a C-pillar or in vehicles, such as two-door coupes, which may omit one of B-pillar 208 and the C-pillar, depending on the pillar nomenclature used.

Figure 7:
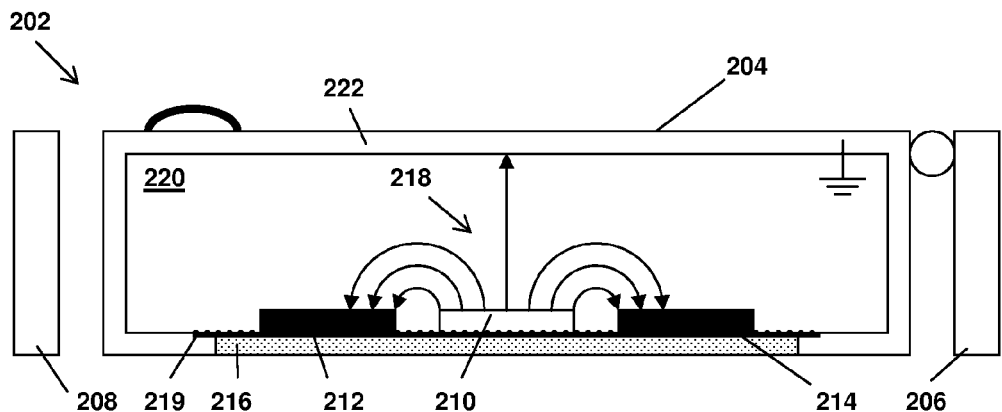
FIG. 7 is a diagram of a vehicle door according to an embodiment.
Figure 8:
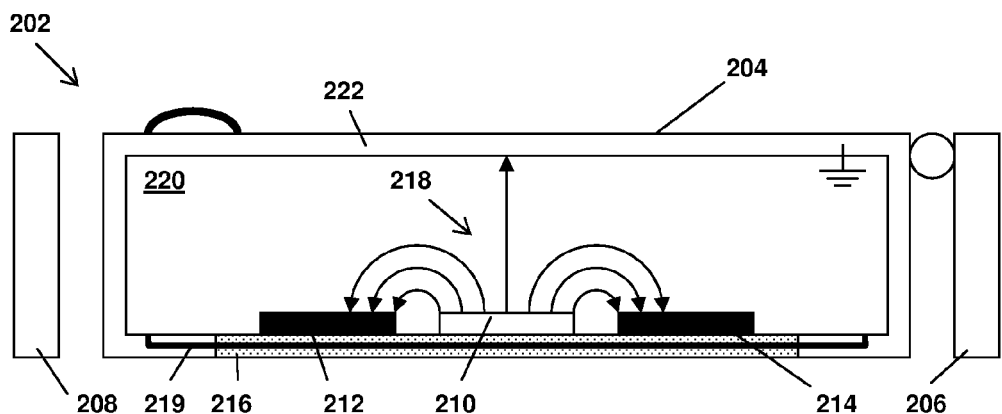
FIG. 8 is a diagram of a vehicle door according to an embodiment.

System 202 comprises a transmit electrode 210, a first receive electrode 212 and a second receive electrode 214 in one embodiment. Electrodes 210-214 are mounted to an inside cover 216 of door 204 such that an electric field 218 created by the electrodes extends into an internal cavity 220 of door 204. Referring also to FIGS. 7 and 8, inside cover 216 comprises a shielding layer 219 in one embodiment to make system 202 insensitive to changes within the passenger area on the other side of door 204, as passenger movement or objects inside the vehicle near door 204 can modify the coupling among electrodes 210-214. Layer 219 is coupled to metal portions of door 204 or in some other manner connected to ground, two example embodiments of which are depicted in FIGS. 7 and 8, respectively.

Figure 9:
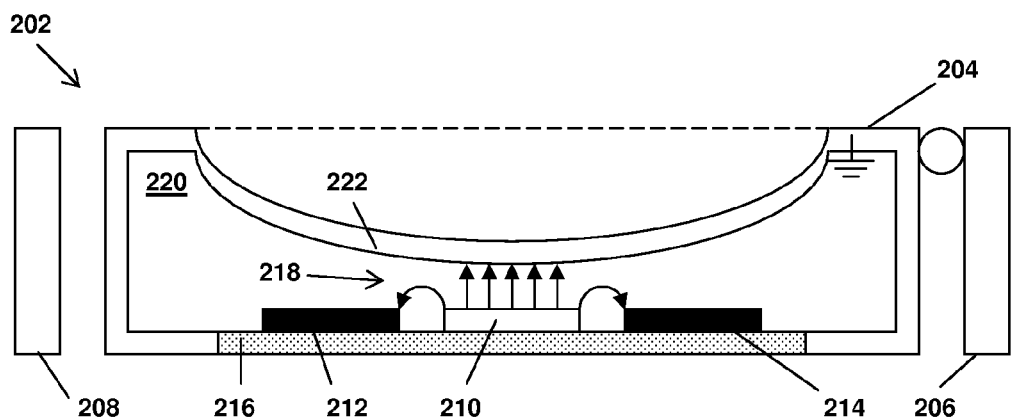
FIG. 9 is a diagram of a deformed vehicle door according to an embodiment.

FIG. 9 depicts door 204 in a deformed state, such as might occur from a side-impact crash. The deformation of external portion 222 of door 204 alters electric field 218 between electrodes 210-214 by reducing the coupling. While a significant deformation is illustrated in FIG. 9, in one embodiment alteration of electric field 218 begins at or very shortly after the moment of impact, in other words at the time deformation begins.

Only a small portion of electric field 218 is shielded by the metal material of door 204 and the coupling between electrode 210 and each of electrodes 212 and 214 is at a maximum in one embodiment. The distance b between electrode 210 and each of electrodes 212 and 214 as well as the size a of electrodes 210-214 can be chosen such that coupling is close to but less than the maximum value that would exist if an external metal portion 222 of door 204 was removed, to provide a measurable change in electric field 218 soon after door 204 begins to be deformed. To aid efficient measurement of deformation, electric field 218 should extend within cavity 220, and a sufficient field density should be present near external portion 222. Thus, in various embodiments, distance b, dimension a, and other characteristics of electrodes 210-214 are on the same order of magnitude as the distance between the walls of door 204. These and other characteristics related to electrodes 210-214 can therefore vary according to characteristics of door 204 and the vehicle design overall in various embodiments. Additionally, dimensions a and b need not be uniform for each electrode 210-214 and can vary.

Figure 10:
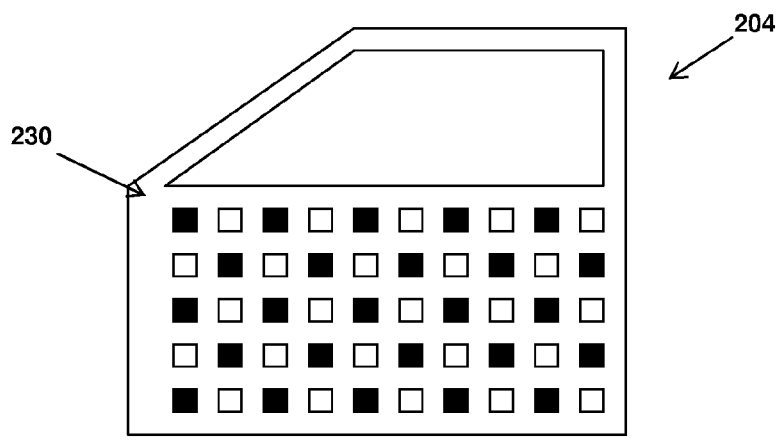
FIG. 10 is a diagram of a vehicle door according to an embodiment.
Figure 11:
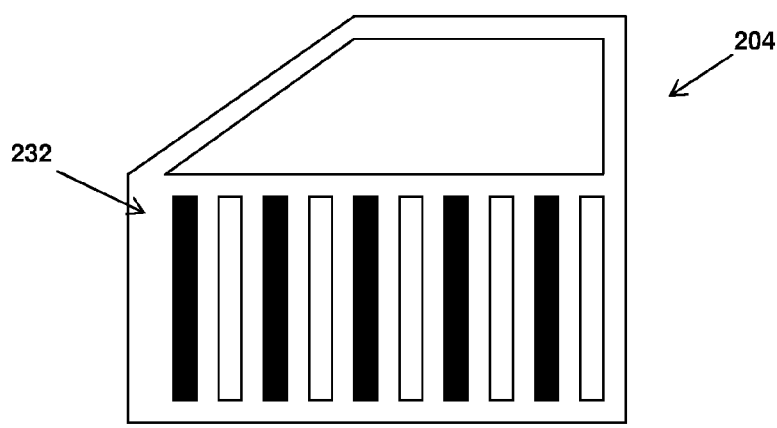
FIG. 11 is a diagram of a vehicle door according to an embodiment.

System 202 can comprise more or fewer electrodes than the three electrodes 210-214 depicted in FIGS. 6-9. To achieve high electric field coverage within cavity 222 independent of the point of impact and type of object, electric field 218 should extend throughout most or all of cavity 222 with a sufficient flux density. Thus, in one embodiment, such as is depicted in FIG. 10, an array 230 comprising a plurality of electrodes is mounted in door 204. Although array 230 is depicted as evenly distributed within door 204, allowance may have to be made in embodiments for other vehicle systems occupying and sharing the same space. Another embodiment is depicted in FIG. 11, comprising array 232. In embodiments, electrodes of the same polarity are coupled together, which can reduce electric component costs.

Figure 12:
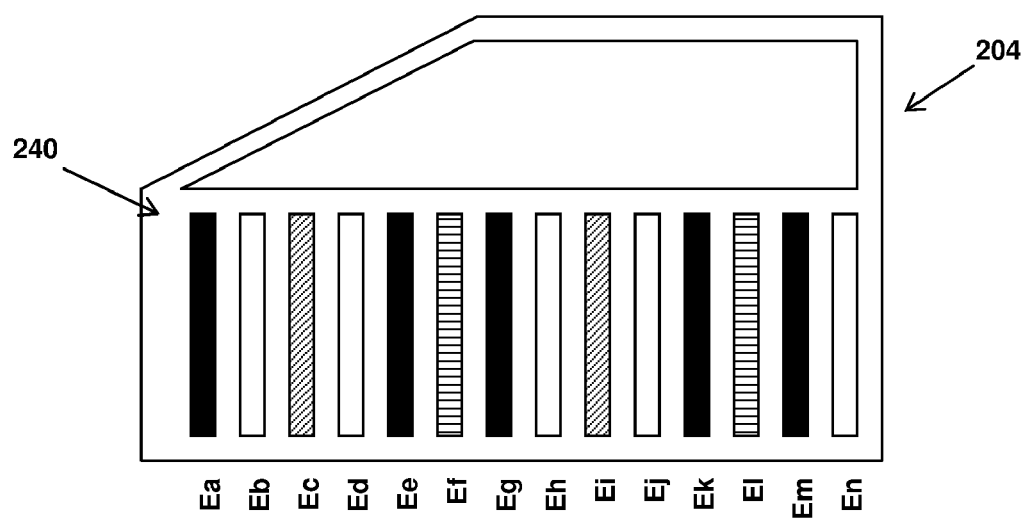
FIG. 12 is a diagram of a vehicle door according to an embodiment.

In yet another embodiment, electromagnetic (EM) emissions of system 202 can be minimized by using a more complex bipolar stimulation array 240, as depicted in FIG. 12. In array 240, electrodes Eb, Ed, Eh, Ej and En are positive transmit electrodes, and electrodes Ec and Ei are positive receive electrodes. Electrodes Ea, Ee, Eg, Ek and Em are negative transmit electrodes, and electrodes Ef and El are negative receive electrodes. As described herein above, alternate numbers and configurations of electrodes can be used in other embodiments.

Figure 13:
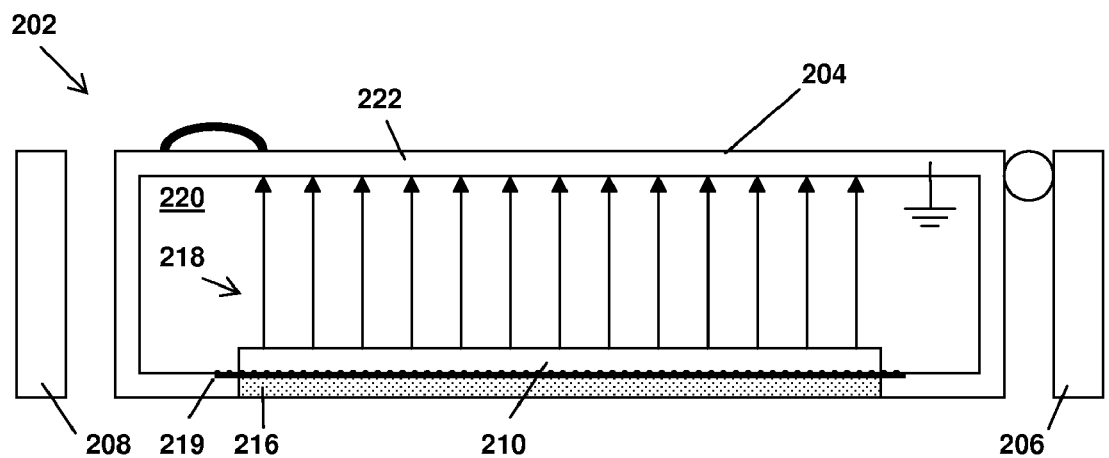
FIG. 13 is a diagram of a vehicle door according to an embodiment.

Capacitive detection can also be single-ended in other embodiments. Referring to FIG. 13, system 202 comprises transmit electrode 210. Electric field 218 is created between electrode 210 and external metal portion 222 of door 204, which is grounded. Electrode 210 and door 204 thus form a large parallel-plate capacitor, and changes in electric field 218 caused by deformation can be detected.

Figure 14:
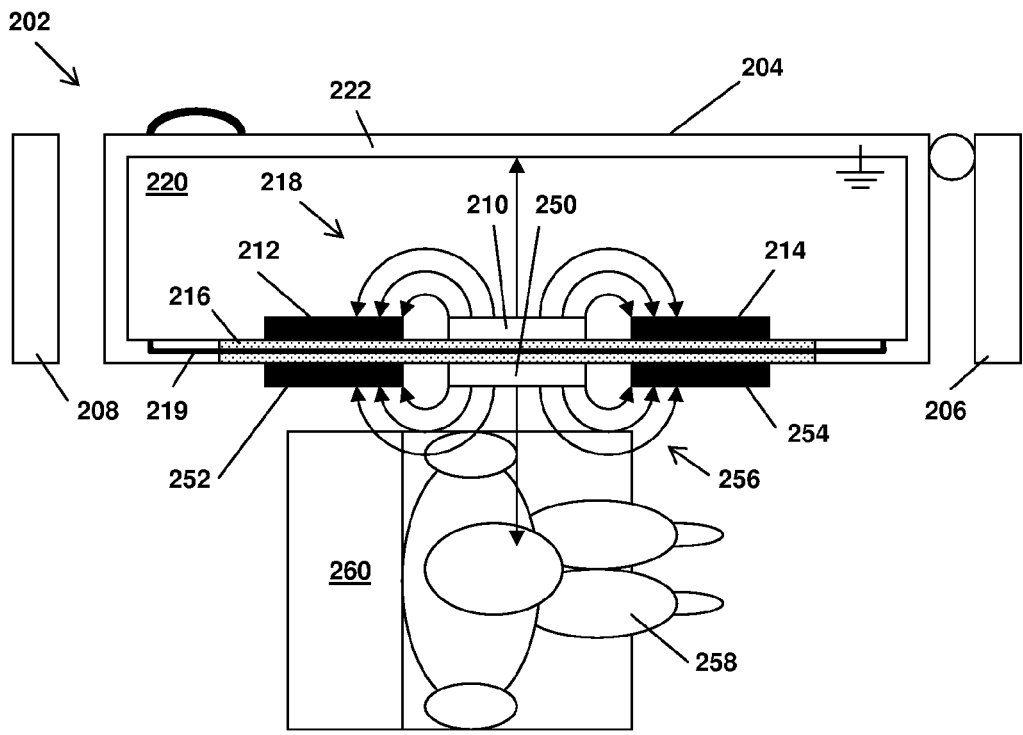
FIG. 14 is a diagram of a vehicle door and seat according to an embodiment.

Electrode arrangements can also be extended to capacitively sense changes on both sides of door 204. Referring to FIG. 14, system 202 comprises a second transmit electrode 250 and receive electrodes 252 and 254 configured to form a second electric field 258 directed inward with respect to door 204 in one embodiment. Such an arrangement provides for crash detection by electrodes 210-214 and vehicle occupant detection by electrodes 250-254. For example, a vehicle occupant 258 seated in a vehicle seat 260 can influence field 256, while the result will be different if no occupant is present in seat 260. Crosstalk between inner electrodes 210-214 and outer electrodes 250-254 can be minimized or avoided altogether by a shielding layer and/or symmetrical arrangement in one embodiment.

Figure 15:
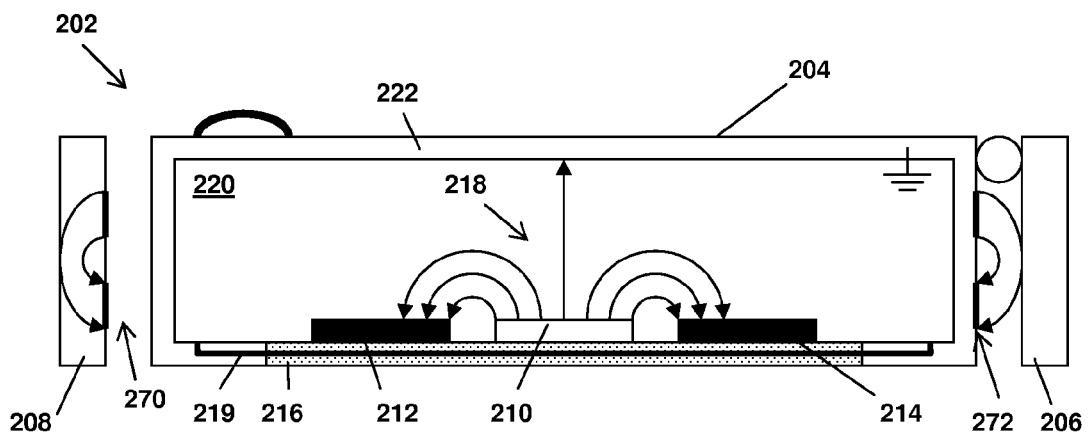
FIG. 15 is a diagram of a vehicle door according to an embodiment.

In another embodiment, and referring to FIG. 15, additional capacitive sensors 270 and 272 can create electric fields to monitor airgaps within vehicle pillars such as B-pillar 208 (sensor 270) and between door 204 and other vehicle components such as A-pillar 206 (sensor 272). Such areas are often not monitored by pressure or other sensors. Thus, system 202 can provide additional safety and monitoring.

Capacitive sensors can also be used in distance detection applications in vehicles, such as for parking assistance, blind spot monitoring, driving in reverse, and the like. As in other embodiments described herein, a plurality of electrodes can be disposed in or on a vehicle, electric fields created, and changes in the electric fields sensed in order to detect impact from a crash or, before that point, to detect the presence of an object. The changes in the electric fields depend in part on various characteristics of the detected object, including size, geometry, material properties, and relative distance. Embodiments of a capacitive distance detection system should be sensitive to object distance regardless of the other characteristics of the object. In other words, to sense an object distance without influence of parasitic parameters related to these other characteristics, embodiments of the capacitive distance detection system can extract pure distance data from the overall capacitive sensor signal information.

Figure 16:
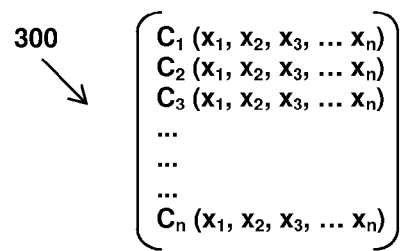
FIG. 16 is a matrix diagram according to an embodiment.

Referring to FIG. 16, a set 300 of capacitance values is depicted. Each sensed capacitance signal $C_1$-$C_n$ depends on a set of object-dependent variables, $x_1$-$x_n$. In one embodiment, a sensor model can uniquely map these variables to the measured capacitances, and the distance variable can be extracted for any combination of object-dependent parameters.

Figure 17:
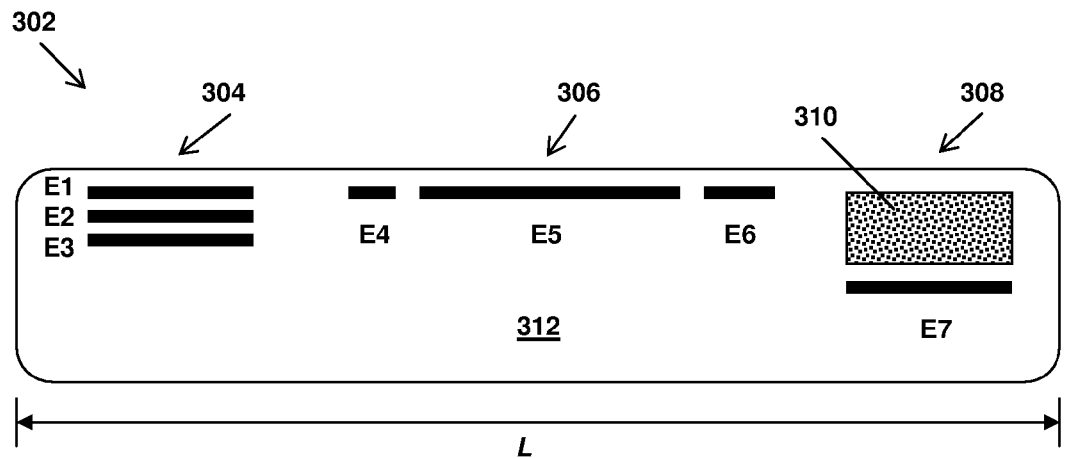
FIG. 17 is a system diagram according to an embodiment.

Referring to FIG. 17, an embodiment of a capacitive distance detecting system 302 is depicted and comprises an arrangement of differently sized and configured electrodes. System 302 comprises an electrode stack 304, a configuration of differently sized electrodes 306, and an electrode cavity arrangement 308. Electrode stack 304 comprises three electrodes E1, E2 and E3 in one embodiment. Electrode configuration 306 comprises three differently sized electrodes E4, E5 and E6. Electrode cavity 308 comprises an electrode E7 disposed adjacent a material deposit 310. System 302 is implemented in or on a vehicle bumper 312 in one embodiment. System 302 can be implemented in other vehicle locations and placements in other embodiments.

The particular arrangement and distribution of system 302, in particular stack 304, configuration 306 and arrangement 308, is but one example of an embodiment. Other electrode arrangements and configurations can be used in other embodiments. In general, however, an arrangement and distribution of system 302 can be selected in one embodiment according to an inversion algorithm to be used for signal evaluation and the particular information desired to be detected and determined. For example, electrode stack 304 can be effective to determine an object distance, as can electrode cavity arrangement 308. While multi-electrode configuration 306 can also provide such information, configuration 306 can also be of use to determine size and other geometrical information. Thus, to determine a wider range of information, a system comprising a plurality of electrode arrangements and configurations can be used in various embodiments.

Additionally, an overall length L of bumper 312 is used to distribute electrode components 304-308. Distributing electrode components 304-308 over most or all of length L provides for the determination of more detailed geometric information of an object. Referring also to FIGS. 1-4, different switching mechanisms can be used with electrodes E1-E7 of components 304-308 to obtain different transmit/receive signals and detection patterns and provide additional distance and geometric information about a detected object.

From these signals and patterns, $C_n$ values can be obtained in various embodiments to form matrix 300 of independent capacitive measurements. A sensor model can then be used in one embodiment to break down the measured capacitance signals into model variables ($x_n$) from which object distances can be determined independent of other signal component variables. While one such approximation model is depicted and described herein, other or additional models can also be used in various embodiments. As mentioned above, the model(s) and algorithm(s) used can depend on the characteristics and components of system 302 and the desired information to be detected and determined, as well as other factors.

Figure 18:
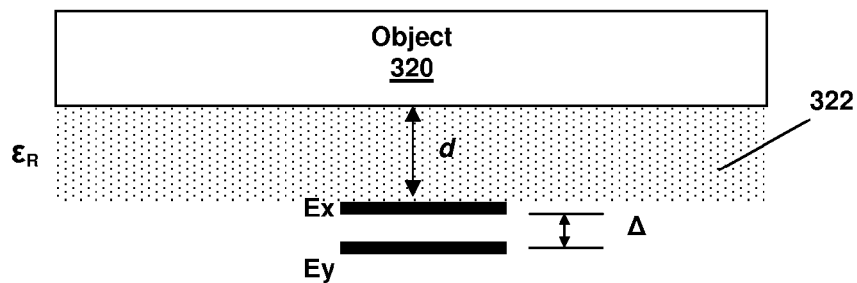
FIG. 18 is a model diagram according to an embodiment.

A parallel plate capacitor model according to one embodiment is depicted in FIG. 18. In the model, an object 320 is modeled as an infinite plate approaching two stacked electrodes Ex and Ey separated by a distance Δ. The capacitances between object 320 and electrodes Ex and Ey depend on a distance d and properties of the material(s) 322 separating them, such as the relative permittivity $\epsilon_R$. Material 322 can include air, the material of bumper 312, and others, such as material 310.

The model maps the capacitances $C_1$ and $C_2$ between electrodes Ex and Ey, respectively, and object 320 to the parameters d and $\epsilon_R$:

$$C_1 = \varepsilon_0 \varepsilon_R \frac{A}{d}$$

$$C_2 = \varepsilon_0 \varepsilon_R \frac{A}{d + \Delta}$$

From $C_1$ and $C_2$, d can be determined:

$$d = \Delta \left[ \frac{C_1}{(C_1 - C_2)} - 1 \right]$$

Figure 19:
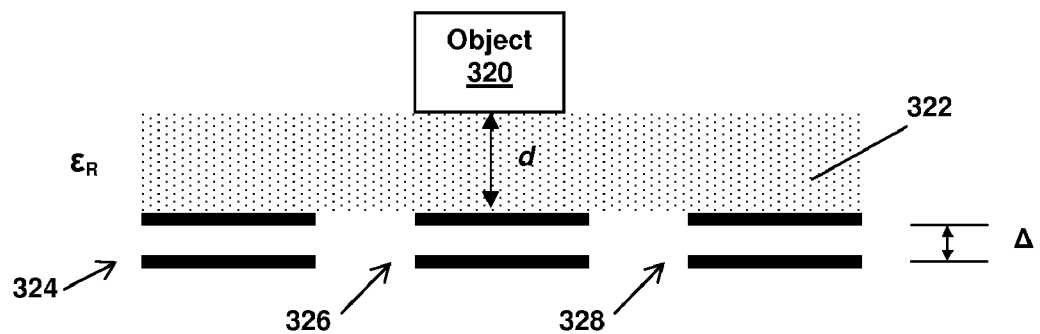
FIG. 19 is a model diagram according to an embodiment.

As depicted in FIG. 19, the model can also be used for more than one electrode pair, which can provide additional information about the size of object 322. In FIG. 19, the model includes three electrode pairs 324, 326 and 328, although more or fewer can be used in other embodiments. Different capacitances $C_1$ and $C_2$ can be measured by electrodes 326 while electrodes 324 and 328 will show no or some other effect, providing an estimation of the size of object 322.

The model of FIGS. 18 and 19 and equations described above are one example of an inversion algorithm which can be used, as they relate the values $C_1$ and $C_2$ back to distance information independent of a material parameter $\epsilon_R$. For an arbitrary model and sensing algorithm in various embodiments, the value $C_n$ is desired, instead of $C_1$ and $C_2$. Thus, a plurality of electrodes and electrode configurations and arrangements are used in embodiments of system 302.

In other embodiments, a capacitive sensor system mounted in a vehicle bumper can, additionally or alternatively, detect crashes and collisions. Such a system can measure the relative distance of mechanically fixed components that can be deformed in a crash, such as the bumper in which the system is mounted and the vehicle chassis in one embodiment. Embodiments of the system can also be combined or operated with a pre-crash detection system as described above and can provide certain advantages over existing accelerometer-based systems.

Figure 20:
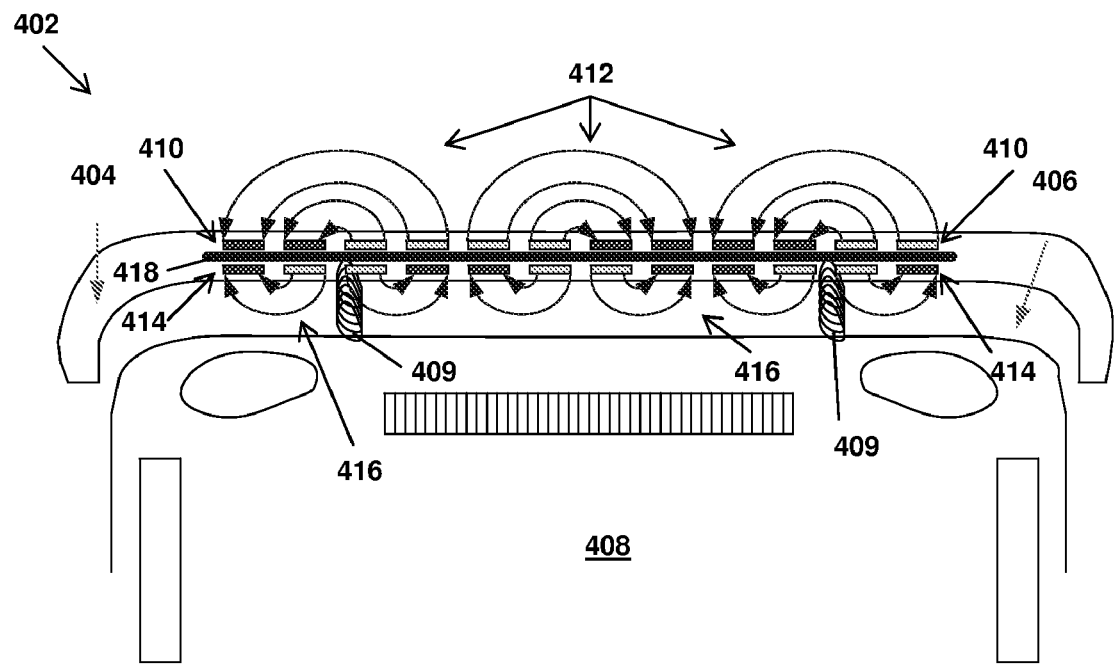
FIG. 20 is a system diagram according to an embodiment.

Referring to FIG. 20, one embodiment of a capacitive sensor system 402 adapted to detect pre-crash and actual crash events is depicted. System 402 is mounted in or on a bumper 404, and bumper 404 is mounted near or to chassis 406 of vehicle 408. In one embodiment, shock or energy absorbers 409 are mounted between bumper 404 and chassis 406.

System 402 comprises a first set of transmit and receive electrodes 410 configured to create an electric field 412 directed outward with respect to vehicle 408. Electrodes 410 and electric field 412 are configured to detect approaching objects, such as in a pre-crash stage, in one embodiment. System 402 also comprises a second set of transmit and receive electrodes 414 configured to create an electric field 416 directed backwards or inwards with respect to vehicle 408. Electrodes 414 and electric field 416 are configured in one embodiment to measure a distance between bumper 404 and chassis 406.

Electrodes 410 and electrodes 414 are isolated by a shield 418 in one embodiment to separate the respective measurements. In another embodiment, electrodes 410 and 414 are arranged and stimulated symmetrically, and shield 418 is omitted.

Figure 21:
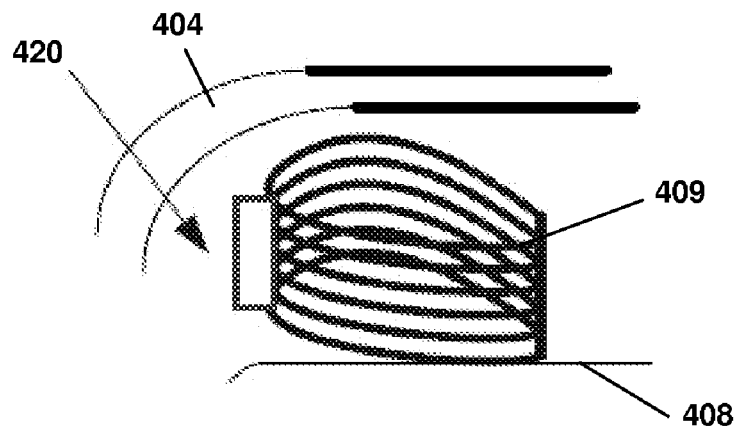
FIG. 21 is a shock absorber diagram according to an embodiment.
Figure 22A:
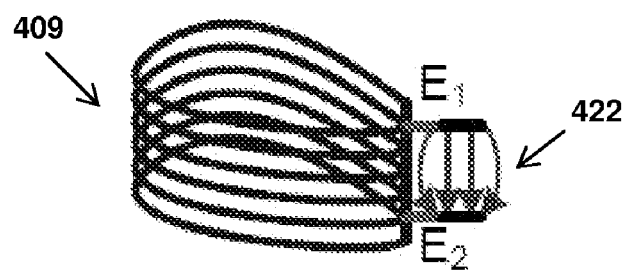
FIG. 22A is a shock absorber diagram according to an embodiment.
Figure 22B:
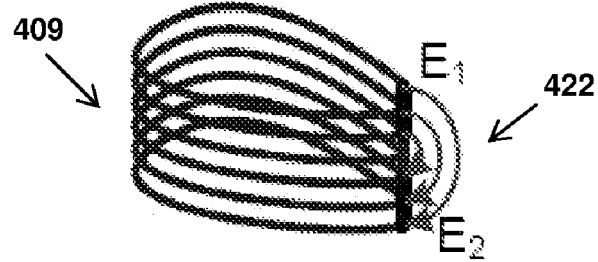
FIG. 22B is a shock absorber diagram according to an embodiment.

In one embodiment, system 402 also comprises one or more capacitive sensors 420 mounted near shock absorbers 409, as depicted in FIG. 21. Referring also to FIGS. 22A and 22B, sensor 420 comprises a first electrode $E_1$ and a second electrode $E_2$ which form an electric field 422 in one embodiment. In FIG. 22A, electrodes $E_1$ and $E_2$ are mounted parallel to and opposite one another. In FIG. 22B, electrodes $E_1$ and $E_2$ are mounted in-line to one another. Other mounting configurations and positions of sensors 420, including electrodes $E_1$ and $E_2$ are used in other embodiments.

In operation, and referring to FIGS. 20-22B, system 402 is configured to detect pre-crash situations when changes in electric field 412 are measured. System 402 is further configured to detect crashes or collisions when changes in electric field 416 are measured. Crashes and collisions can also be detected when changes in electric field 422 and/or electric field 412 are measured in other embodiments. Various switching mechanisms and configurations, for example those described herein above with reference to FIGS. 1-4, can be used in system 402 to provide additional information about a detected object or event.

Figure 23:
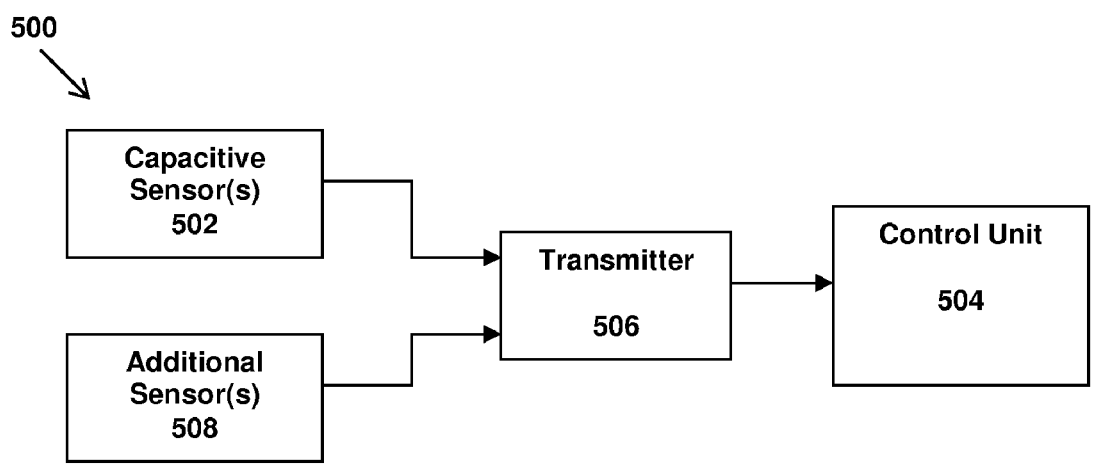
FIG. 23 is a block diagram of a system according to an embodiment.

In various embodiments, the electrodes and capacitive sensors described herein above comprise integrated circuits and are coupled and provide information to a control unit. Referring to FIG. 23, a capacitive sensor system 500 comprises one or more capacitive sensors 502 coupled to a control unit 504. Capacitive sensors 502 can comprise one or more of the electrodes and sensors described herein above with respect to FIGS. 1-22B, which can comprise integrated circuit components coupled to one or more local or remote measurement application-specific integrated circuits (ASIC). Control unit 504 can be local or remote with respect to one or more of sensors 502 in various embodiments. In other embodiments, control unit 504 comprises a plurality of subunits and/or circuits that can be located together or separately. For example, in one embodiment one of the measurement ASIC and the control unit comprises switching circuitry configured to reconfigure a plurality of electrodes, such as described and depicted with respect to FIGS. 1-4. In automotive applications, control unit 404 can be coupled to, integrated with, or part of a vehicle electronics control unit or other system.

In various embodiments, for example as described above with respect to FIGS. 6-15, the electrodes and/or arrays of sensors 502 are coupled to one or more intermediate transmitter circuits 506 configured to provide spatial information related to which region or regions of door 204 are deformed. Such a configuration enables selective firing of one or more airbags in response to the detected deformation. Transmitter circuits 506 are local to sensors 502 and communicate with aforementioned control unit 504, which is remote, in one embodiment. Other configurations can also be used. In other embodiments, transmitter circuits 506 can be omitted.

Embodiments of system 500 can also comprise one or more additional sensors 508. In one embodiment, sensor 508 is a pressure sensor. Sensor redundancy can be used in safety critical and other applications. For example, an airbag system can comprise a pressure sensor 508 in addition to capacitive sensing system 202 of FIGS. 6-15. The information sensed by one of the sensors can be used to verify and cross-check information sensed by the other.

Although specific embodiments have been illustrated and described herein for purposes of description of an example embodiment, it will be appreciated by those of ordinary skill in the art that a wide variety of alternate and/or equivalent implementations calculated to achieve the same purposes may be substituted for the specific embodiments shown and described without departing from the scope of the present invention. Those skilled in the art will readily appreciate that the invention may be implemented in a very wide variety of embodiments. This application is intended to cover any adaptations or variations of the various embodiments discussed herein, including the disclosure information in the attached appendices. Therefore, it is manifestly intended that this invention be limited only by the claims and the equivalents thereof.

The invention claimed is:

1. A capacitive sensor system comprising:
a plurality of electrodes, pairs of the plurality of electrodes being coupleable to form capacitive sensors configured to create electric fields directed outward from a vehicle;
a switching mechanism coupled to each of the plurality of electrodes to selectively couple the plurality of electrodes to form a first set of capacitive sensors and to selectively recouple the plurality of electrodes to form at least one additional set of capacitive sensors, the first and at least one additional sets of capacitive sensors comprising differently coupled pairs of the plurality of electrodes; and
a control unit coupled to the plurality of electrodes and configured to measure a change in the electric fields.

2. The system of claim 1, wherein the control unit comprises the switching mechanism.

3. The system of claim 1, wherein the plurality of electrodes are mounted to a body portion of the vehicle.

4. The system of claim 3, wherein the plurality of electrodes are mounted to a bumper of the vehicle.

5. The system of claim 4, further comprising a plurality of additional electrodes mounted in the bumper, forming at least one additional capacitive sensor and configured to create at least one additional electric field directed toward a chassis of the vehicle.

6. The system of claim 5, further comprising at least one further capacitive sensor configured to detect a change in a shock absorber of the vehicle.

7. The system of claim 1, wherein the plurality of electrodes are mounted within a door of the vehicle.

8. The system of claim 7, further comprising at least one additional electrode coupled to the control unit and configured in an array with the plurality of electrodes.

9. The system of claim 7, further comprising a pressure sensor mounted within the door and coupled to the control unit.

10. A method comprising:
capacitively sensing an object relative to a vehicle by coupling a plurality of electrodes into a first capacitive sensing configuration, and
coupling the plurality of electrodes into a second capacitive sensing configuration different from the first capacitive sensing configuration; and
communicating information related to the object based on information obtained from the plurality of electrodes coupled in the first and second capacitive sensing configurations.

11. The method of claim 10, further comprising mounting the plurality of electrodes to a vehicle.

12. The method of claim 11, further comprising mounting the plurality of electrodes to a side portion of the vehicle.

13. The method of claim 12, wherein capacitively sensing further comprising detecting the object pre-crash.

14. The method of claim 11, further comprising mounting the plurality of electrodes to a bumper portion of the vehicle.

15. The method of claim 14, further comprising capacitively sensing a change in the bumper.

16. The method of claim 10, wherein capacitively sensing further comprises obtaining information related to at least one of a size and a distance of the object.

17. A method comprising:
configuring a capacitive sensor to sense an object relative to a vehicle, the capacitive sensor comprising a plurality of electrodes selectively switchable into a plurality of capacitive sensor configurations;
providing a path to communicate information from the capacitive sensor.

* * * * *